United States Patent [19]

Suzuki et al.

[11] Patent Number: 4,601,013
[45] Date of Patent: Jul. 15, 1986

[54] MAGNETIC BUBBLE MEMORY DEVICE

[75] Inventors: Ryo Suzuki, Kodaira; Yutaka Sugita, Tokorozawa; Naoki Kodama; Masatoshi Takeshita, both of Hachioji; Teruaki Takeuchi, Kokunbunji, all of Japan

[73] Assignee: Hitachi, Ltd., Tokyo, Japan

[21] Appl. No.: 706,182

[22] Filed: Feb. 27, 1985

Related U.S. Application Data

[63] Continuation of Ser. No. 451,094, Dec. 20, 1982, abandoned.

[30] Foreign Application Priority Data

Dec. 18, 1981 [JP] Japan ................................ 56-203723

[51] Int. Cl.[4] ............................................. G11C 19/08
[52] U.S. Cl. ..................................................... 365/36
[58] Field of Search ............................ 365/15, 16, 36

[56] References Cited

U.S. PATENT DOCUMENTS

| 4,086,572 | 4/1978 | Bullock | 365/36 |
| 4,171,389 | 10/1979 | Gyorgy et al. | 427/130 |
| 4,346,456 | 8/1982 | Kinoshita et al. | 365/36 |

FOREIGN PATENT DOCUMENTS 0125289 7/1983 Japan ...................................... 365/36

*Primary Examiner*—James W. Moffitt
*Attorney, Agent, or Firm*—Antonelli, Terry & Wands

[57] ABSTRACT

Disclosed is a magnetic bubble memory device having a first bubble propagation path formed in an ion-implantation pattern and a second bubble propagation path made of permalloy elments in combination. The majority of the area for forming the second propagation path is processed by ion implantation in lower density and to smaller depth than those of ion implantation for forming the first propagation path on the surface of a bubble supporting layer.

9 Claims, 8 Drawing Figures

MAGNETIC BUBBLE MEMORY DEVICE

This is a continuation of application Ser. No. 451,094 filed Dec. 20, 1982 and now abandoned.

The present invention relates to a memory device for storing information in the form of bubbles of cylindrical magnetic domain, so-called magnetic bubbles, and more particularly, to a magnetic bubble memory device using a bubble propagation path formed by ion-implantation and a bubble propagation path formed of magnetically soft elements in combination.

In order to realize magnetic bubble memory device of high packaging density, formation of bubble propagation paths by ion-implantation is now under examination. In such a device, ions such as He+ are implanted in accordance with a predetermined pattern on the surface of a bubble supporting layer, in which a magnetic bubble is held and propagated, so as to form a region in which magnetization is directed in the plane of the bubble supporting layer thereby to form a bubble propagation path. This propagation path (will be termed "ion-implantation propagation path" hereafter) is formed in a pattern without a gap, facilitating lithographical processes, and is advantageous for fabricating a device of high packaging density. However, in order for the magnetic bubble memory to be completed, the device needs to have functional portions for generating, replicating and detecting a magnetic bubble and controlling the propagation of the bubble, in addition to the storage loop formed by the propagation path. With regard to the ion-implantation propagation path, there have not been achieved a replicater for making a replica of data on a propagation path and a swap gate for controlling data exchange between two propagation paths with satisfactory operational stability.

On the other hand, with regard to the propagation path formed of an alignment of magnetically soft elements such as permalloy (will be hereafter termed "soft-magnetic element propagation path"), although there have been realized replicaters and swap gates which operate stably, but it is disadvantageous for fabricating a device of high packaging density due to a certain gap width between patterns beyond which the gap can not be narrowed.

A copending U.S. patent application, Ser. No. 375,344, Sugita et al. filed on May 5, 1982, now U.S. Pat. No. 4,528,645 discloses a compound magnetic bubble memory device which realizes high packing density and also stable operation. In this compound magnetic bubble memory device, the great part of storage loops (minor loops) are formed of an ion-implantation propagation path, and a read line for reading out data from the minor loops, a write line for writing data onto the minor loops, and a switch or replicater for connecting the read/write lines to the minor loops are formed of magnetically soft elements.

One object of the present invention is to improve the marginal propagating performance of a soft-magnetic element propagation path in a compound magnetic bubble memory device.

Another object of the invention is to provide a magnetic bubble memory device which presents a sufficient detection output.

The present invention features that a magnetic bubble supporting layer beneath the soft-magnetic element propagation path and in the neighborhood thereof is given a condition of ion implantation which is different from the condition of ion implantation for forming the ion-implantation propagation path. More particularly, a portion for forming a soft-magnetic element pattern is provided with a thinner ion implantation layer, or the distortion in the plane of the layer caused by ion implantation is relieved, or both the measures are taken.

The present invention will now be explained in conjunction with the accompanying drawings, in which.

Figure 4:
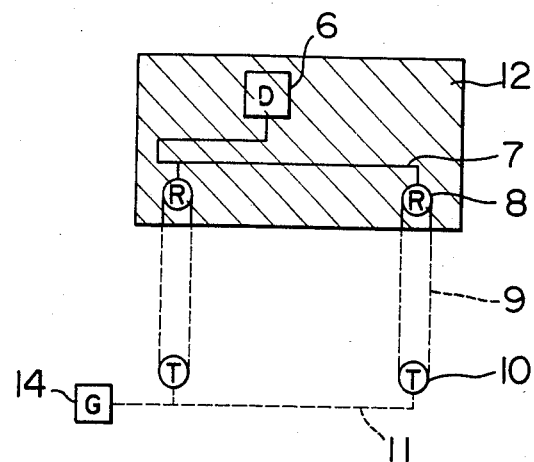
Figure 5:
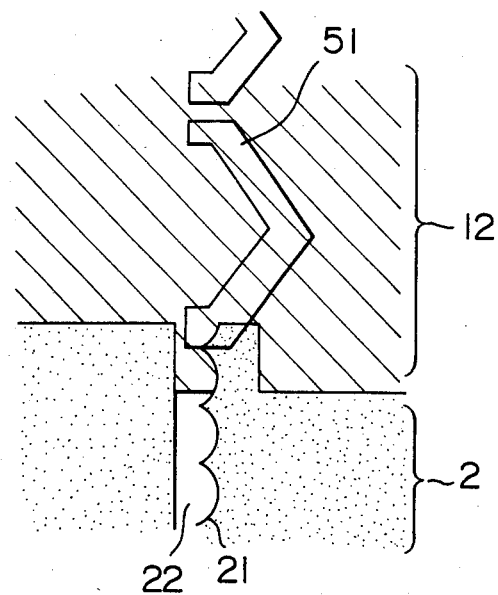
Figure 6:
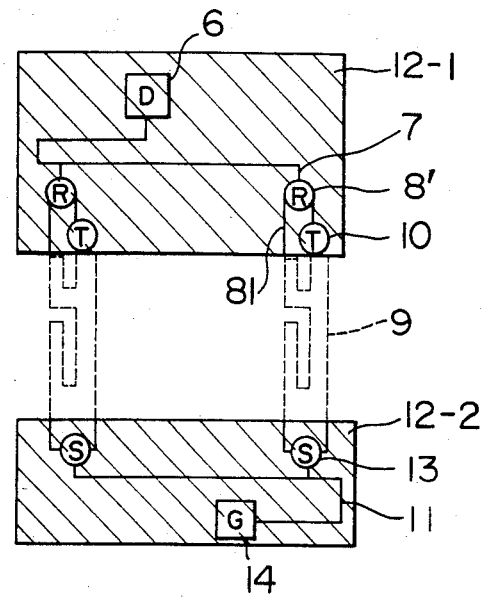
Figure 7:
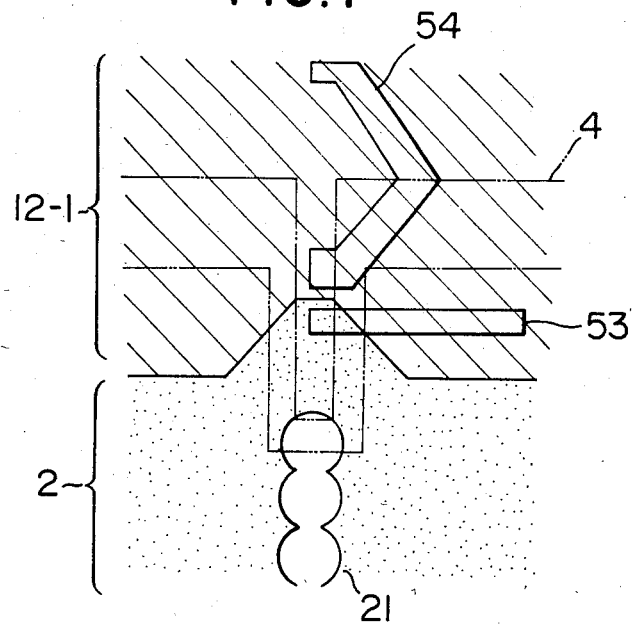

FIGS. 4 and 6 are plan views showing embodiments of the inventive magnetic bubble memory device; and FIGS. 5 and 7 are plan views showing in detail the connections shown in FIGS. 4 and 6, respectively.

Figure 8:
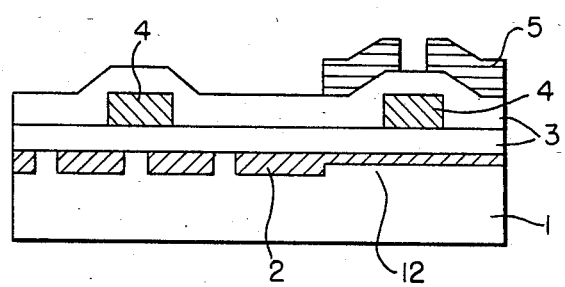

FIG. 8 is a cross-sectional view showing the structure of a magnetic bubble memory device using the ion-implanted propagation path and soft-magnetic propagation path including thick and thin ion-implanted regions.

Figure 1:
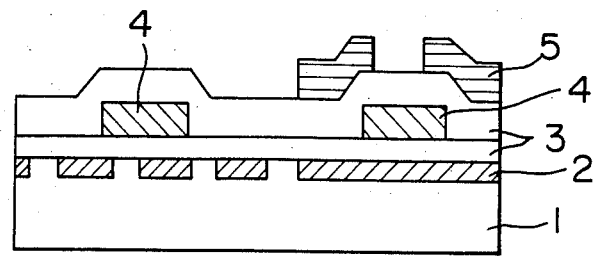
FIG. 1 is a cross-sectional view showing the structure of a magnetic bubble memory device using the ion-implanted propagation path and soft-magnetic propagation path in combination according to the abovementioned copending U.S. application.

FIG. 1 is a cross-sectional view showing a part of the magnetic bubble memory device disclosed in the abovementioned U.S. patent application Ser. No. 375,344. In the figure, the left half of the structure is an ion-implantation propagation path. On the surface of a magnetic bubble supporting layer 1 formed on a substrate (not shown) excluding patterns for the propagation path, ion implantation is carried out to form an ion-implantation layer 2. A conducting layer 4 for the pulse current of controlling the stretch or division of the magnetic bubble is formed over the ion-implanted layer 2 through an insulation layer 3. The right half of the structure is a soft-magnetic element propagation path, where permalloy elements 5 are placed over the conducting layer 4 through the insulation layer 3 so as to form the soft-magnetic element propagation path. The device of the above-mentioned structure has an ion-implanted layer 2 also beneath the permalloy elements 5 produced by ion-implantation for forming the ion-implantation propagation path. However, the magnetism of the ion-implanted layer 2 is directed in the plane of the layer, causing a magnetic shielding effect. Therefore, the magnetic field produced by the permalloy elements 5 is weakened by the ion-implanted layer, resulting in a weak bubble driving force. The leakage flux from the magnetic bubble is also weakened, and the output of the detector for sensing the leakage flux from the bubble is also reduced.

Figure 2:
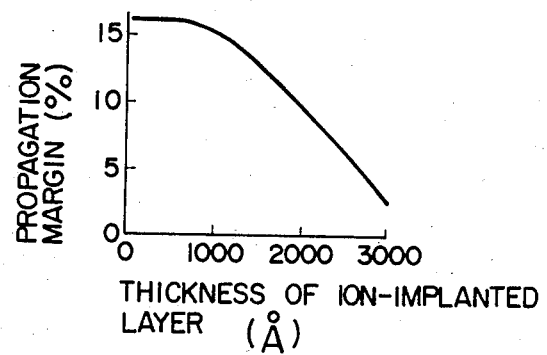
FIG. 2 is a graphical representation showing the relationship between the thickness of the ion-implanted layer 2 and the propagation margin.

FIG. 2 shows the relationship between the thickness of the ion-implanted layer 2 and the propagation margin of asymmetric Chevron permalloy propagation path having a pitch of 8 μm, for the ion-implanted layer 2 having a distortion of approximately 1% formed by implanting He+ on the magnetic bubble thin film having a thickness of 1.1 μm and a width of the magnetic domain of 1.0 μm. The revolving magnetic field has a magnitude of 60 Oe, presenting a quasi-static operation. It was found that the propagation margin decreases for the thickness of the ion-implanted layer above 1000 Å as shown in the figure.

Figure 3:
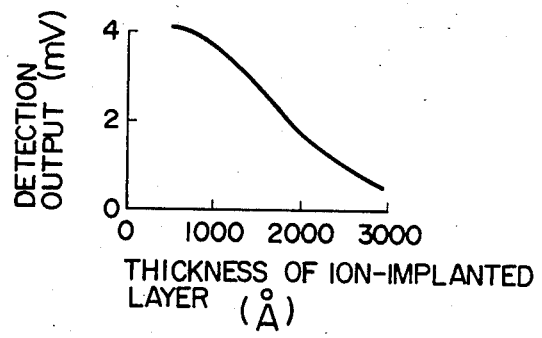
FIG. 3 is a graphical representation showing the relationship between the thickness of the ion-implanted layer 2 and the detection output.

FIG. 3 shows the dependence of the detection output on the thickness of the ion-implanted layer for the magnetic bubble detector which consists of a magnetic bubble stretcher and detecting elements of thick film permalloy and operates by utilization of principle of magnetoresistance. The revolving magnetic field has a magnitude of 60 Oe at a frequency of 300 kHz, and the detection current is 3 mA. As shown in the figure, it was found that the detection output decreases sharply as the thickness of the ion-implahted layer increases. The dependence of the falling propagation margin and detection output on the thickness of the ion-implanted layer differs depending on the type of ion and the degree of residual distortion caused by ion implantation.

These phenomena are presumably caused by the magnetic field shielding effect by the ion-implanted layer. That is, the ion-implanted layer 2 is a magnetic layer with its magnetization directed in the plane of the layer, and therefore the magnetic flux from the soft-magnetic propagation path 5 is weakened by the ion-implanted layer 2, resulting in a weakened bubble driving force. The leakage flux from a magnetic bubble is also weakened and the output of a detector which senses the leakage flux from the magnetic bubble is reduced. It will be appreciated that these problems can be prevented by making the ion-implanted layer beneath the soft-magnetic element propagation path and in the neighborhood thereof thinner than the ion-implanted layer of the ion-implantation propagation path, or making the degree of distortion in the plane of the layer caused by ion implantation small, or by taking both the measures.

Different thicknesses of the ion-implanted layer for the ion-implantation propagation path and the soft-magnetic element propagation path can be achieved by different conditions of ion-implantation such as different acceleration voltages. The degree of distortion can be varied by varying the density of ion-implantation or by selective heat treatment by means of such as laser-annealing following the ion-implantation under the same condition.

The invention will be described in more detail by way of embodiment.

EMBODIMENT 1

In the device having a major line and minor loops as shown in FIG. 4, a write major line 11 and greater part of minor loops 9 were formed of an ion-implantation propagation path and the remaining part of the minor loops 9 and a read major line 7 were formed of permalloy propagation path. In the figure, the permalloy propagation path is shown by the solid line, while the ion-implantation propagation path is shown by the dashed line. The ion-implantation propagation path is formed by the $H_2^+$ implantation of $2\times10^{16}$ ions/cm$^2$ at an acceleration voltage of 35 keV and by the $H_2^+$ implantation of $4\times10^{16}$ ions/cm$^2$ at an acceleration voltage of 60 keV. The thickness of the ion-implanted layer in this case was 3000 Å approximately. Hatched region 12, i.e., portions above the detector 6, the read major line 7 and the minor loops 9, was simply processed by the Ne$^+$ implantation of $1\times10^{14}$ ions/cm$^2$ at an acceleration voltage of 50 keV for preventing the generation of a hard bubble. The thickness of the ion-implanted layer in this case was 600 Å approximately.

A transfer gate 14 was used, which is identical to that disclosed in IEEE Transaction on Magnetics, Vol. MAG-17, No. 1, pp. 1134–1141. Various types of replicater can be used for replicater 8, and in this embodiment, a block replicater disclosed in IEEE Transcation on Magnetics, Vol. MAG-12, No. 6, pp. 614–617 was used.

This type of device poses a problem on the bubble propagation characteristics in the boundary between the ion-implanted portion for creating the ion-implantation propagation path and the portion without such ion-implantation.

FIG. 5 is an enlarged plan view showing the boundary portion. Region 2 is ion-implanted to form an ion-implanted path 21, and region 12 is processed by ion implantation for preventing the generation of a hard bubble. The latter ion-implantation does not need to be limited to the region 12, but may be carried out for the entire surface of the device.

A magnetic bubble propagated on the ion-implanted path 21 is attracted by a magnetic pole created on a permalloy element 51, then transferred along the outer edge of the element toward the top of the figure. The boundary between the ion-implanted region 2 and the ion-implanted region 12 is located midway on the permalloy element 51. In order to improve the propagation characteristics in the boundary portion, the permalloy element 51 was made to have a length several times the pitch of the ion-implantation propagation path 21. The device was operated in the revolving magnetic field at a frequency of 100 kHz, and a marginal bias magnetic field of 8% relative to the total operating magnetic field was obtained. A large detection output of 1 mV/1 mA was also achieved.

EMBODIMENT 2

FIG. 6 shows another embodiment of the present invention. In this embodiment, a magnetic bubble generator 14, a write line 11 and a part of minor loops 9 connected to the write line 11 by swap gates 13 are formed of the soft-magnetic element propagation path, made of permalloy elements. The ion-implantation propagation path shown by the dashed line in the figure was processed by the Ne$^+$ implantation of $1\times10^{14}$ ions/cm$^2$ at 50 keV, the Ne$^+$ implantation of $2\times10^{14}$ ions/cm$^2$ at 180 keV, and the $H_2^+$ implantation of $3\times10^{16}$ ions/cm$^2$ at 100 keV, and the remaining portions (regions 12-1 and 12-2 in FIG. 6) were entirely processed by the Ne$^+$ implantation of $1\times10^{14}$ ions/cm$^2$ at 40 keV and the $H_2^+$ implantation of $3\times10^{16}$ ions/cm$^2$ at 60 keV. The thickness of the ion-implanted layer was 4000 Å approximately for the former-mentioned portions and 3000 Å approximately for the latter-mentioned portions, (see FIG. 8). A much deeper ion-implanted layer was formed in the portion of the soft-magnetic element propagation path as compared with the embodiment shown in FIG. 4. Such deeper ion implantation is effective for preventing the generation of a hard bubble, and also effective for sharing the bias magnetic field range, where a magnetic bubble exists in the bubble supporting layer, for the portion of the ion-implantation propagation path and the portion of the permalloy propagation path. In more detail, a magnetic bubble can exist in the bubble supporting layer only when the bias magnetic field applied perpendicularly to the layer falls in a certain range, and particularly, a critical field Ho which provides the upper limit of the range varies depending on the depth of ion implantation and the amount of ion-implantation. It is undesirable for a magnetic bubble device to have portions with significantly different value of this. For the purpose of preventing such a situation, the regions 12-1 and 12-2 were also ion-implantated to a depth and in a density which are in a range where the propagation margin for the soft-magnetic propagation path and the detection output by the bubble detector are not adversely affected.

In this embodiment, the upper end of the minor loop 9 is connected to the permalloy propagation path using a transfer gate 10. For this, as shown in FIG. 7, a hairpin-shaped conductor 4 is disposed so as to connect the ion-implantation propagation path and the soft-magnetic element propagation path made of permalloy elements 53 and 54. Normally, a magnetic bubble is propagated on the ion-implantation propagation path 21 constituting a minor loop, and only when replication is needed, the magnetic bubble is transferred to the permalloy propagation path by supplying a current to the conductor 4.

Returning to FIG. 6 for further explanation, a replicater 8' used in this embodiment is different from the replicater 8 in FIG. 4, but is a passive replicater, and it divides each coming magnetic bubble into two without using any special pulse current. One of the divided magnetic bubble goes through a read line 7 to a bubble detector 6, and the other one returns through a bypass 81 to the minor loop 9 formed of the ion-implantation propagation path. The number of bits of the bypass 81 has been adjusted so that a magnetic bubble coming through the replicater returns to the original bit address in the minor loop. The abovementioned passive replicater is disclosed in IEEE Transaction on Magnetics, Vol. MAG-16, p. 858, (1980), by L. Tao et al.

In this embodiment, the ion-implantation propagation path is connected directly to the soft-magnetic element propagation path on the side of the write line, and the arrangement is identical to that shown in FIG. 5 on this aspect. However, modification may be made such that the write line 11 is connected to the minor loop 9 formed of the soft-magnetic element propagation path using a transfer gate made of a hairpin-shaped conductor.

We claim:

1. A magnetic bubble memory device comprising:
   a bubble supporting layer in which a bubble of cylindrical magnetic domain is held and propagated;
   a first ion-implanted region formed in a surface area of said bubble supporting layer, said region having an ion-implantation pattern forming a first bubble propagation path which propagates a magnetic bubble in accordance with a driving magnetic field revolving in the plane of said bubble supporting layer;
   a plurality of magnetically soft elements formed over said bubble supporting layer, said elements being connected to said first bubble propagation path so as to form a second bubble propagation path which propagates a magnetic bubble in accordance with said driving magnetic field; and
   a second ion-implanted region for hard buble suppresion formed in a surface of said bubble supporting layer so as to confront at least a majority of the area where said second bubble propagation path is formed, said second ion-implanted region being thinner than siad first ion-implanted region, said second ion-implanted region having a thickness of at most 1000 Angstroms.

2. A magnetic bubble memory device according to claim 1, wherein said second ion-implanted region is formed by ion-implantation with a lower acceleration voltage than that for forming said first ion-implanted region.

3. A magnetic bubble memory device according to claim 1, wherein said second ion-implanted region is formed over the entire surface of the device.

4. A magnetic bubble memory device according to claim 1, wherein said first ion-implanted region is formed in a surface region of the bubble supporting layer other than a region thereof beneath said plurality of magnetically soft elements.

5. A magnetic bubble memory device according to claim 1, wherein said second ion-implanted region has a smaller distortion in the plane of the layer than that of said first ion-implanted region.

6. A magnetic bubble memory device according to claim 5, wherein said second ion-implanted region has a lower ion-implantation density than that of said first ion-implanted region.

7. A magnetic bubble memory device according to claim 5, wherein said second ion-implanted region is formed by selective annealing.

8. A magnetic bubble memory device according to claim 1, wherein said second ion-implanted region is formed over a portion of the surface of said bubble supporting layer under said magnetically soft elements and other than said first ion-implanted region.

9. A magnetic bubble memory device according to claim 8, wherein said second ion-implanted region is formed over the entirety of said portion of the surface of said bubble supporting layer under said magnetically soft elements.

* * * * *